US012317735B2

(12) United States Patent
Liu et al.

(10) Patent No.: US 12,317,735 B2
(45) Date of Patent: May 27, 2025

(54) FLEXIBLE AND STRETCHABLE SEMICONDUCTOR DEVICES WITH REDUCED FOOTPRINTS AND METHODS THEREFOR

(71) Applicant: The Board of Trustees of the Leland Stanford Junior University, Stanford, CA (US)

(72) Inventors: Yuxin Liu, Stanford, CA (US); Yuqing Zheng, Stanford, CA (US); Zhenan Bao, Stanford, CA (US)

(73) Assignee: The Board of Trustees of the Leland Stanford Junior University, Stanford, CA (US)

( * ) Notice: Subject to any disclaimer, the term of this patent is extended or adjusted under 35 U.S.C. 154(b) by 469 days.

(21) Appl. No.: 17/694,577

(22) Filed: Mar. 14, 2022

(65) Prior Publication Data
US 2022/0293859 A1  Sep. 15, 2022

Related U.S. Application Data

(60) Provisional application No. 63/161,344, filed on Mar. 15, 2021.

(51) Int. Cl.
  *H10K 71/40* (2023.01)
  *H10K 10/46* (2023.01)
  (Continued)

(52) U.S. Cl.
  CPC ........... *H10K 71/40* (2023.02); *H10K 10/471* (2023.02); *H10K 10/481* (2023.02);
  (Continued)

(58) Field of Classification Search
  CPC .... H10K 71/40; H10K 10/471; H10K 10/481; H10K 10/484; H10K 10/84; H10K 71/60; H10K 10/464; H10K 10/466; H10K 77/111; H10K 85/111; H10K 85/1135; H10K 85/141; H10K 85/151
  See application file for complete search history.

(56) References Cited

U.S. PATENT DOCUMENTS

2005/0230752 A1* 10/2005 Kanno ............. H01L 29/42384
                                                    438/149
2006/0154406 A1*  7/2006 Tanaka ............. H01L 29/66757
                                                    257/E21.115

(Continued)

*Primary Examiner* — Duy T Nguyen
(74) *Attorney, Agent, or Firm* — Foley & Lardner LLP

(57) ABSTRACT

A method of making flexible and stretchable semiconductor devices with reduced footprints can include coating a gate electrode layer having a first composition over an elastomer layer, solidifying a portion of the gate electrode layer by irradiation to form a gate electrode, coating a dielectric layer having a second composition over the gate electrode layer, solidifying a portion of the dielectric layer by the irradiation to form a gate dielectric, coating a semiconductor layer having a third composition over the dielectric layer, solidifying a portion of the semiconductor layer by the irradiation to form a device core, coating a terminal layer having the first composition over the dielectric layer, and solidifying a portion of the terminal layer by the irradiation to form a source electrode and a drain electrode contacting the semiconductor layer.

14 Claims, 19 Drawing Sheets

(51) Int. Cl.
*H10K 10/84* (2023.01)
*H10K 71/60* (2023.01)
H10K 77/10 (2023.01)
H10K 85/10 (2023.01)

(52) U.S. Cl.
CPC ........... *H10K 10/484* (2023.02); *H10K 10/84* (2023.02); *H10K 71/60* (2023.02); *H10K 10/464* (2023.02); *H10K 10/466* (2023.02); *H10K 77/111* (2023.02); *H10K 85/111* (2023.02); *H10K 85/1135* (2023.02); *H10K 85/141* (2023.02); *H10K 85/151* (2023.02)

(56) References Cited

U.S. PATENT DOCUMENTS

| | | | | |
|---|---|---|---|---|
| 2011/0248243 | A1* | 10/2011 | Chen | B82Y 10/00 |
| | | | | 257/29 |
| 2017/0098791 | A1* | 4/2017 | Bao | H10K 10/471 |
| 2017/0346013 | A1* | 11/2017 | Chung | C08G 61/125 |
| 2019/0250510 | A1* | 8/2019 | Okachi | H10K 71/20 |
| 2021/0343878 | A1* | 11/2021 | Ohta | H01L 21/823418 |

* cited by examiner

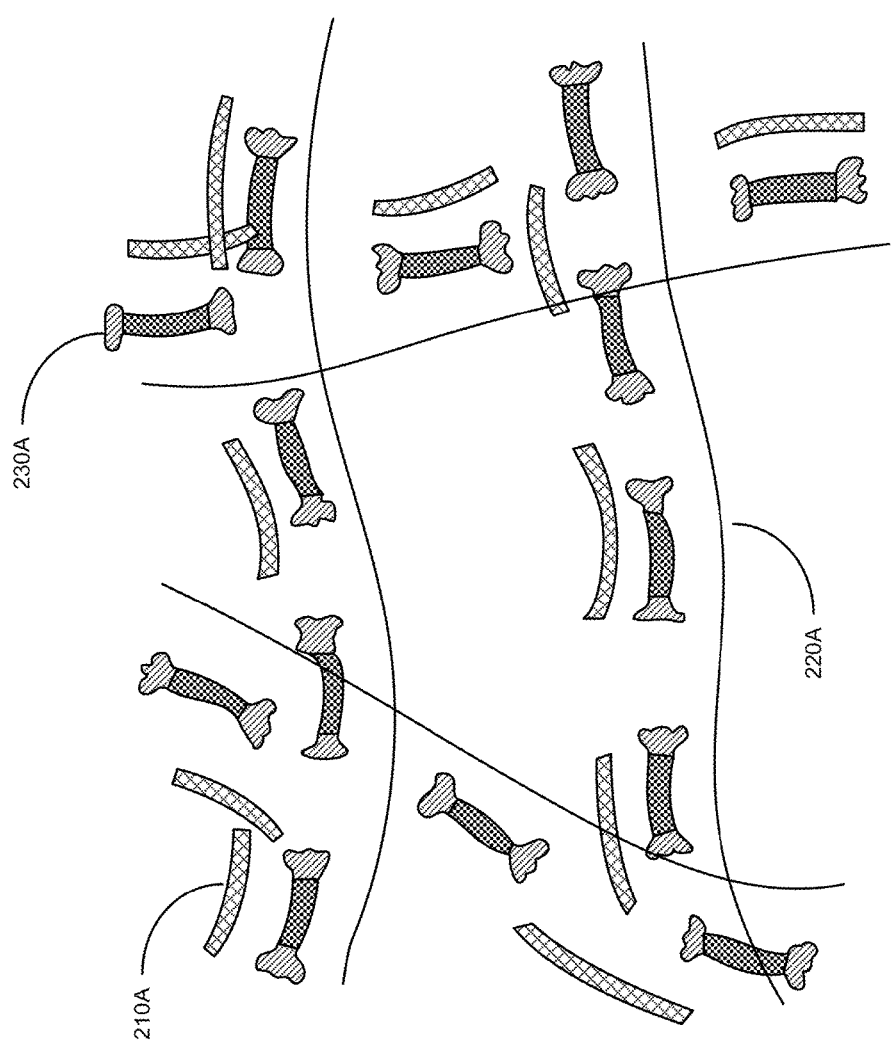

1000

(1002)

↓

Coat Gate Electrode Layer over Stretchable Elastomer Layer   1010

Spin-Coat Electrode Layer with PEDOT:PSS and PEGDMA   1012

↓

Mask Surface of Device with Gate Electrode Pattern   1020

Expose Shape of Gate Electrode Element through Mask   1022

↓

Solidify Exposed Portion(s) of Gate Electrode Layer   1030

Solidify by Crosslinking PEGDMA of Gate Electrode Layer   1032

Irradiate Exposed Portion(s) by Ultraviolet Exposure   1034

↓

Remove Unexposed Portion(s) of Gate Electrode Layer   1040

Remove Liquid Portion(s) of Gate Electrode Layer   1042

FLEXIBLE AND STRETCHABLE SEMICONDUCTOR DEVICES WITH REDUCED FOOTPRINTS AND METHODS THEREFOR

CROSS-REFERENCE TO RELATED PATENT APPLICATIONS

This application claims priority to U.S. Provisional Patent Application Ser. No. 63/161,344, entitled "MONOLITHIC OPTICAL MICRO-MANUFACTURING OF HIGH-DENSITY ELASTIC CIRCUITS," filed Mar. 15, 2021, the contents of all such applications being hereby incorporated by reference in its entirety and for all purposes as if completely and fully set forth herein.

TECHNICAL FIELD

The present implementations relate generally to electronics, and more particularly to flexible and stretchable semiconductor devices with reduced footprints.

BACKGROUND

Electronic devices are increasingly desired for application in more diverse and complex environments. These environments may subject the electronic devices to mechanical strain that exceed applications in controlled environments. In addition, expectations of computational performance continue to increase, including expectations of high speed for completion of complex computations that can be deployed in environments with size constraints. Thus, there exists a need for electronic devices with high computational capability, high physical strain tolerance, and high compressibility into smaller form factors.

SUMMARY

Present implementations are directed to high-density electronic logic devices fabricated on flexible substrates, and capable of non-destructive deformation in response to mechanical forces applied to the substrate. Thus, the substrate and the electronic device layers patterned thereon are both able to non-destructively deform in response to stretching, twisting, bending, and the like. The electronic logic devices can include transistors, logical gates, and any component including transistors or logical gates, for example. Such components can include, but are not limited to flip=flops, gate arrays, multiplexers and demultiplexers, and the like. Electronic devices in accordance with present implementations can be advantageously fabricated at high density due to significantly smaller footprints possible through the manufacturing processes discussed herein. The smaller footprints allow high-density fabrication of electronic logic devices, dramatically increasing the computational power available per unit of surface area on a flexible electronic device. Thus, present implementations can enable a significant increase in computing power available in flexible electronics. Thus, a technological solution for flexible and stretchable semiconductor devices with reduced footprints is provided.

A method of making flexible and stretchable semiconductor devices with reduced footprints can include coating a gate electrode layer having a first composition over an elastomer layer, solidifying a portion of the gate electrode layer by irradiation to form a gate electrode, coating a dielectric layer having a second composition over the gate electrode layer, solidifying a portion of the dielectric layer by the irradiation to form a gate dielectric, coating a semiconductor layer having a third composition over the dielectric layer, solidifying a portion of the semiconductor layer by the irradiation to form a device core, coating a terminal layer having the first composition over the dielectric layer, and solidifying a portion of the terminal layer by the irradiation to form a source electrode and a drain electrode contacting the semiconductor layer.

The method can include solidifying the portion of the gate electrode layer by crosslinking PEGDMA in the gate electrode layer by the irradiation.

In the method, the first composition can include the PEGDMA, PEDOT and PSS.

The method can include masking a second portion of the gate electrode layer distinct from the portion of the gate electrode layer, to block crosslinking of PEGDMA in the second portion of the gate electrode layer by the irradiation.

In the method, the solidifying the portion of the dielectric layer can include crosslinking PMMA-PnBA-PMMA in the dielectric layer by the irradiation.

In the method, the second composition can include the PMMA-PnBA-PMMA and branch diazirine.

The method can include masking a second portion of the dielectric layer distinct from the portion of the dielectric layer, to block crosslinking of PMMA-PnBA-PMMA in the second portion of the dielectric layer by the irradiation.

In the method, the solidifying the portion of the semiconductor layer can include crosslinking DPPTT in the semiconductor layer by the irradiation.

In the method, the third composition can include the DPPTT and branch diazirine.

The method can include masking a second portion of the semiconductor layer distinct from the portion of the semiconductor layer, to block crosslinking of DPPTT in the second portion of the dielectric layer by the irradiation.

In the method, the solidifying the portion of the terminal layer can include crosslinking PEGDMA in the terminal layer by the irradiation.

The method can include masking a second portion of the terminal layer distinct from the portion of the gate electrode layer, to block crosslinking of PEGDMA in the second portion of the terminal layer by the irradiation.

In the method, the irradiation can include exposure to ultraviolet radiation.

The method can include coating the elastomer layer over a substrate, the elastomer layer can include a stretchable elastomer.

A semiconductor device can include a substrate having a first composition and deformable in one or more directions, a gate electrode having a second composition and disposed on the substrate, a dielectric layer having a third composition and disposed on the gate electrode and the substrate, a semiconductor layer having a fourth composition and disposed over the gate electrode, a source electrode having the second composition and disposed over and in contact with the semiconductor layer, and a drain electrode having the second composition and disposed over and in contact with the semiconductor layer.

In the device, the gate electrode can have a substantially elongated structure.

In the device, the semiconductor layer can have a substantially elongated structure corresponding to the substantially elongated structure of the gate electrode, and can be disposed over the substantially elongated structure of the gate electrode.

In the device, the source electrode can have a substantially elongated structure extending in a direction substantially orthogonal to the substantially elongated structure of the gate electrode.

In the device, the drain electrode can have a substantially elongated structure extending in a direction substantially parallel to the substantially elongated structure of the source electrode.

In the device, the source electrode and the drain electrode can extend in opposite directions from the semiconductor layer.

BRIEF DESCRIPTION OF THE DRAWINGS

These and other aspects and features of the present implementations will become apparent to those ordinarily skilled in the art upon review of the following description of specific implementations in conjunction with the accompanying figures, wherein:

FIG. 2A illustrates a state of a composition of a flexible electronic device before irradiation, in accordance with present implementations.

FIG. 10 illustrates a method of manufacturing a flexible electronic device including irradiation, further to the method of FIG. 9.

DETAILED DESCRIPTION

Figure 1A:
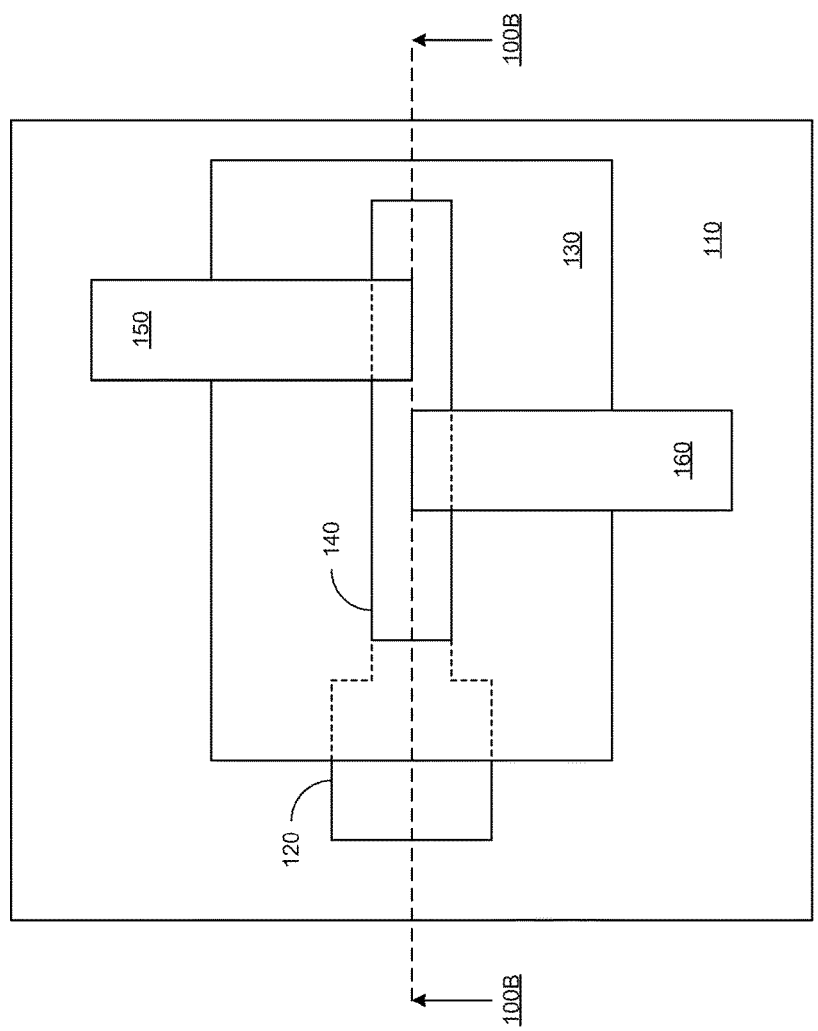
FIG. 1A illustrates a plan view of a flexible electronic device in accordance with present implementations.

The present implementations will now be described in detail with reference to the drawings, which are provided as illustrative examples of the implementations so as to enable those skilled in the art to practice the implementations and alternatives apparent to those skilled in the art. Notably, the figures and examples below are not meant to limit the scope of the present implementations to a single implementation, but other implementations are possible by way of interchange of some or all of the described or illustrated elements. Moreover, where certain elements of the present implementations can be partially or fully implemented using known components, only those portions of such known components that are necessary for an understanding of the present implementations will be described, and detailed descriptions of other portions of such known components will be omitted so as not to obscure the present implementations. Implementations described as being implemented in software should not be limited thereto, but can include implementations implemented in hardware, or combinations of software and hardware, and vice-versa, as will be apparent to those skilled in the art, unless otherwise specified herein. In the present specification, an implementation showing a singular component should not be considered limiting; rather, the present disclosure is intended to encompass other implementations including a plurality of the same component, and vice-versa, unless explicitly stated otherwise herein. Moreover, applicants do not intend for any term in the specification or claims to be ascribed an uncommon or special meaning unless explicitly set forth as such. Further, the present implementations encompass present and future known equivalents to the known components referred to herein by way of illustration.

Present implementations can include a number of flexible layers patterned onto a flexible substrate. Each of the flexible layers can have various material compositions providing semiconductor-related properties. The flexible layers can be deformable in response to deformation or mechanical stress as discussed herein, and can return to their original shapes after the application of the stress. The flexible layers can maintain their electronic properties during and after application of mechanical stress resulting in deformation. Thus, electronic devices including the flexible layers can operate as part of a fully flexible electronic device. As one example, mechanical stress can include deformation in response to body movements for wearables electronic devices. Each of the flexible layers can be disposed in a stacks of layers to implement, for example a transistor device. A transistor device can include a gate electrode disposed on a flexible substrate, and a dielectric layer disposed on the gate layer. The device can also include a semiconductor layer disposed on the dielectric layer and electrically isolated from the gate electrode layer by the dielectric layer. At a top surface opposite to the flexible substrate, the device can include source and drain layers disposed on the semiconductor layer in contact with the semiconductor layer, and electrically isolated from the gate electrode layer by the dielectric layer.

Devices in accordance with present implementations can be fabricated by patterning including selective irradiation of pattern layers, including the layers discussed herein. This patterning by selective irradiation can advantageously allow fabrication of flexible electronic devise and components at significantly reduced size, on the order, for example, of one-tenth or less the size of flexible electronics fabricated differently.

A fabrication process in accordance with present implementations can include layers having compositions that advantageously demonstrate particular semiconductor properties, are flexible in response to mechanical stress, and are compatible with the irradiation-based patterning discussed herein. As one example, the layers can include various compositions that are substantially liquid or liquid-like before irradiation, and become substantially solid after irradiation, while demonstrating various semiconductor properties. A mask can be applied to a substrate to indicate which portions of a layer should be irradiated to form a portion of the flexible electronic device. Upon application of the irradiation, the portion that has been irradiated can become substantially solid, while the portion that has not been irradiated can remain substantially liquid. The substantially liquid portion can then be removed while the substantially solid portion remains. This process can be repeated for multiple layers each having various compositions. The compositions can include a particular balance of chemicals to advantageously ensure that the composition is substantially liquid before irradiation, substantially solid after irradiation, exhibits a particular electrical property for the electronic device, and exhibits a flexible mechanical property. Thus, the layers and the fabrication process including the layers provide numerous individual advantages that can be synthesized to provide a technological solution for flexible and stretchable semiconductor devices with reduced footprints.

FIG. 1A illustrates a plan view of a flexible electronic device in accordance with present implementations. As illustrated by way of example in FIG. 1A, an example device in plan view 100A can include a flexible substrate 110, a gate electrode 120, a dielectric layer 130, a semiconductor layer 140, a source electrode 150, and a drain electrode 160.

The flexible substrate 110 can include a deformable solid with a planar structure. The flexible substrate 110 can have a wafer-like structure corresponding to a fabrication process including deposition of a flexible polymer onto a wafer substrate. The wafer substrate can correspond to a semiconductor fabrication substrate. The flexible substrate 110 can be deformable in multiple directions, axes, and at multiple angles. As one example, the flexible substrate 110 can be stretched along a direction parallel to the plane of the substrate. As another example, the plane of the flexible substrate 110 can be bent or otherwise deformed. The deformations to the flexible substrate 110 can be nondestructive, and the flexible substrate can return to its original shape.

The gate electrode 120 can be disposed on the flexible substrate 110 and can have an elongated structure. A first end of the elongated structure can terminate in an electrode pad having a width greater than the width of the elongated structure. The gate electrode 120 can include a first composition corresponding to terminal electrode components of the device 100.

The dielectric layer 130 can be disposed on the gate electrode 120 and on the flexible substrate 110, and can have a planar structure. The planar structure can have a width greater than that of the elongated structure of the gate electrode 120, and can advantageously cover a portion of the gate electrode 120 and the flexible substrate 100 to electrically isolate the gate electrode from layers disposed on the dielectric layer 130. The dielectric layer 130 can include a second composition corresponding to an insulator of the device 100.

The semiconductor layer 140 can be disposed on the dielectric layer 130 and substantially disposed over the gate electrode layer 120. The semiconductor layer 140 can be electrically isolated from the gate electrode 120 by the dielectric layer. The semiconductor layer 140 can have an elongated structure corresponding in size and shape to the elongated structure of the gate electrode 120. Thus, the dielectric layer 130 can be disposed between, and in direct contact with the gate electrode layer 120 and the semiconductor layer 140, to form a transistor gate region.

The source electrode 150 can be disposed on the semiconductor layer 140 and the flexible substrate 110 and can have an elongated structure. A first end of the elongated structure of the source electrode 150 can terminate in contact with the semiconductor layer 140, and a second end of the elongated structure can extend away from the semiconductor layer 140 onto one or more of the dielectric layer 130 and the flexible substrate 110. As one example, the source electrode 150 can extend away from the semiconductor layer 140 in a direction perpendicular or orthogonal to the direction of the elongated structure of the semiconductor layer 140. The source electrode 150 can include a first composition corresponding to terminal electrode components of the device 100. As one example, the first composition of the source electrode 150 can be the same as the first composition of the gate electrode 120.

The drain electrode 160 can be disposed on the semiconductor layer 140 and the flexible substrate 110 and can have an elongated structure. A first end of the elongated structure of the drain electrode 160 can terminate in contact with the semiconductor layer 140, and a second end of the elongated structure can extend away from the semiconductor layer 140 onto one or more of the dielectric layer 130 and the flexible substrate 110. As one example, the drain electrode 160 can extend away from the semiconductor layer 140 in a direction perpendicular or orthogonal to the direction of the elongated structure of the semiconductor layer 140. As another example, the drain electrode 160 can extend away from the semiconductor layer 140 in a direction parallel to the direction of the elongated structure of the semiconductor layer 140, and on an opposite side of the semiconductor layer 140. The source electrode 150 can include a first composition corresponding to terminal electrode components of the device 100. As one example, the first composition of the source electrode 150 can be the same as the first composition of the gate electrode 120.

Present implementations can advantageously achieve transistors with ideal p-type transfer characteristics. As one example, a device 100 can demonstrate small hysteresis and an average saturation mobility of 0.255 $cm_2$ $V_{-1\ S-1}$, as extracted from a near-ideal, quadratic current dependence on gate-source voltage, and threshold voltage ($V_{th}$) of −0.61±0.45 V. Minimal variability between transistors is critical for designing complex integrated circuits based on the transistor device simulations. Thus, present implementations can advantageously achieve complex systems through high yield in manufacturing of small-footprint individual devices in accordance with, for example, device 100. A high device yield can be at least 98.5% with a narrow distribution of mobilities with standard deviation of only 3.76%.

Present implementations in accordance with device 100 can also be subjected to at least 100% strain along both parallel and perpendicular to channel length direction without any observable cracks or delamination, advantageously achieving robust mechanical properties of the flexible substrate 110 as well as all device layers 120, 130, 14, 150 and

160. Electrical performances of the device 100 including carrier mobilities, threshold voltages and on-currents can remain stable at up to 100% applied strain along the channel length direction, where mobility can be maintained at 88% of its original value and threshold voltage close to 0 V. The device 100 can be stretched perpendicular to the channel length direction without resulting in change to the on-current of the transfer curve. The device 100 can also advantageously sustain up to 1,000 repeated stretching cycles under 50% mechanical deformation along both directions with negligible change in electrical performance, to provide a device with applicability in many commercial spaces, including but not limited to wearable electronic devices.

In summary, present implementations can provide direct optical lithography of elastic polymeric electronic materials with μm-scale resolution, high yield and excellent uniformity without compromising their electronic and mechanical characteristics, to advantageously increase elastic-transistor density by at least two orders of magnitude. It is to be understood that direct optical formation of electroactive materials in accordance with present implementations can be extended to both direct laser- and electron beam-writing approaches to further increase spatial resolution. Additional materials such as biosensing polymers and organic light-emitting materials can also be integrated to construct complex electronic devices. Present implementations can thus advantageously provide industrial manufacturing of large-scale intrinsically elastic circuits.

Figure 1B:
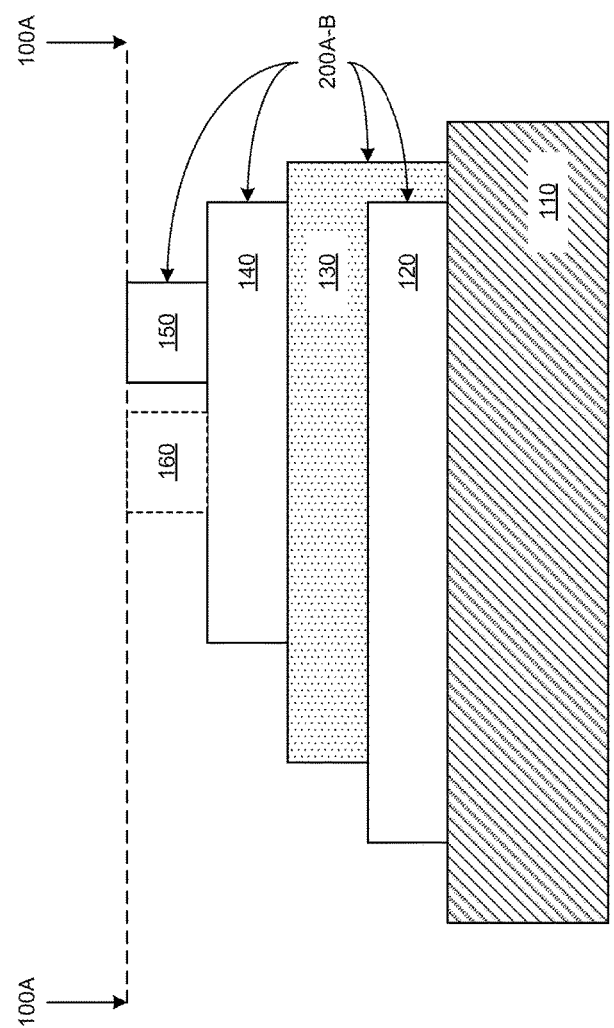
FIG. 1B illustrates a cross-sectional view of a flexible electronic device further to the plan view of FIG. 1A.

FIG. 1B illustrates a cross-sectional view of a flexible electronic device further to the plan view of FIG. 1A. As illustrated by way of example in FIG. 1B, an example device in cross-sectional view 100B can include the flexible substrate 110, the gate electrode 120, the dielectric layer 130, the semiconductor layer 140, the source electrode 150, and the drain electrode 160. Each of the layers 120, 130, 140, 150 and 160 can include various compositions in accordance with the composition of FIG. 2A in states 200A in 200B. It is to be understood that the respective compositions of 120, 130, 140 and 150 can be distinct from one another with respect to electrical properties and can exhibit physical properties with respect to solidification in response to exposure to ultraviolet irradiation.

Present implementations can include inverter and NAND gates, which can constitute basic functional units in elastic digital ICs. As one example, an application area for these devices can include on-skin signal processing and computing. Present implementations can provide Pseudo-D and Pseudo-E inverters with channel lengths ranging from 10 μm to 100 μm. As one example, an elastic inverter with 10 um channel length can be fabricated, which is more than one order of magnitude improvement in spatial resolution. With its high uniformity and close-to-zero-10 threshold voltage of the transistor, a Pseudo-D 10 μm inverter can be powered by a low input voltage of 3 V, which is advantageous for on-skin electronics applications. By varying the input voltage from 0 to 3 V, the output voltage can change from approximately 3 V to GND. Pseudo-E 50 μm inverters can advantageously operate with logic output states of 1 and 0 under logic input states of 0 and 1, even when stretched up to 100% strain. Present implementations can thus achieve advantageously high uniformity and high yield of transistors.

As one example, NAND gates consisting of six transistors can demonstrate well-defined high and low output logic levels as logic '1' and '0' with a low operation voltage down to 3 V. Even under 100% strain along the channel length direction, the NAND gate can retaine correct output logic. More complicated logic circuits, such as an XOR gate including, for example, 24 elastic transistors, and a half adder including, for example, 54 elastic transistors, can exhibit rail-to-rail outputs indicating all the elastic transistors working collectively. These fundamental circuit elements advantageously provide electronics with expanded integration scale and complexity for use in signal processing and computing in skin-like electronics applications.

Figure 1C:
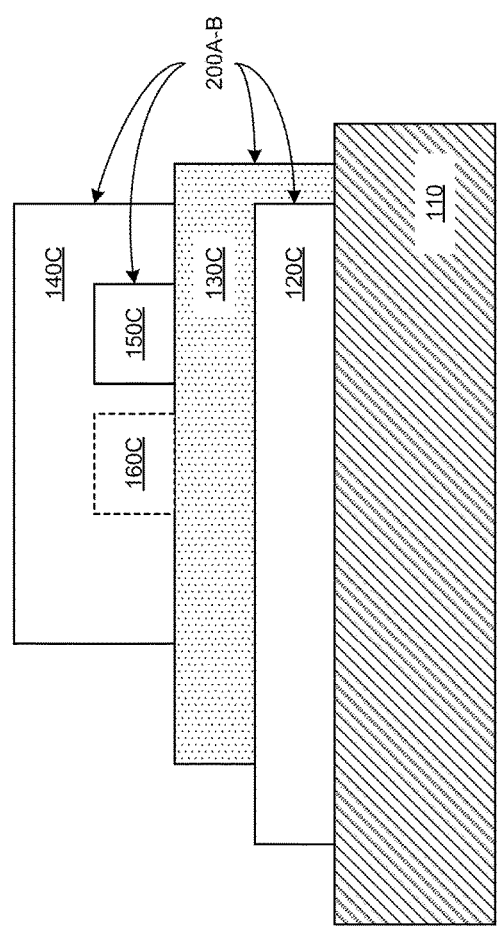
FIG. 1C illustrates a cross-sectional view of a flexible electronic device in accordance with present implementations.

FIG. 1C illustrates a cross-sectional view of a flexible electronic device in accordance with present implementations. As illustrated by way of example in FIG. 1C, an example device in cross-sectional view 100C can include the flexible substrate 110, a gate electrode 120C, a dielectric layer 130C, a source electrode 150C, a drain electrode 160C, and a semiconductor layer 140C. Each of the layers 120C, 130C, 140C, 150C and 160C can include various compositions in accordance with the composition of FIG. 2A in states 200A in 200B. It is to be understood that the respective compositions of 120C, 130C, 140C, 150C and 160C can be distinct from one another with respect to electrical properties and can exhibit physical properties with respect to solidification in response to exposure to ultraviolet irradiation. It is to be further understood that the structure of device 100C can correspond to the structure illustrated in 100A, and can be formed by the mask structures illustrated by way of example in FIGS. 3-7. It is to be further understood that the order of fabrication illustrated in 100C can be achieved by the methods of FIGS. 9-14, and that present implementations are not limited to the order of steps illustrated by way of example herein.

Figure 1D:
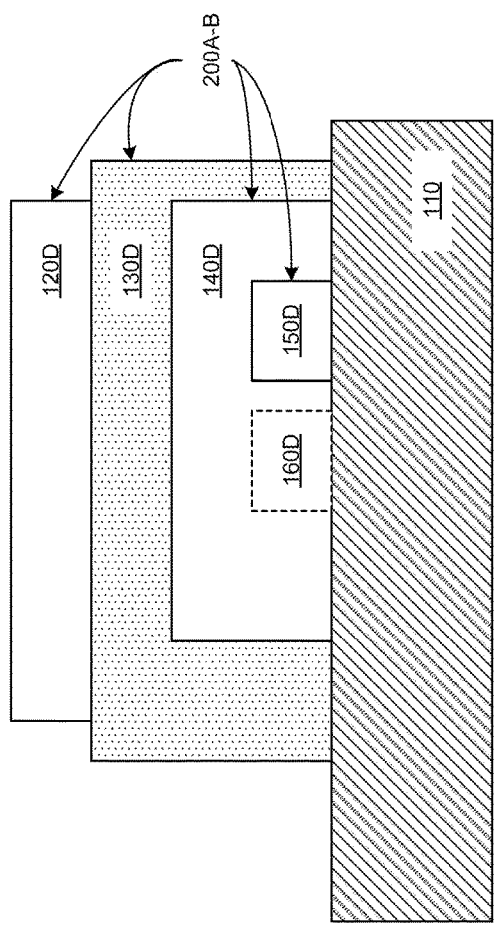
FIG. 1D illustrates a cross-sectional view of a flexible electronic device in accordance with present implementations.

FIG. 1D illustrates a cross-sectional view of a flexible electronic device in accordance with present implementations. As illustrated by way of example in FIG. 1D, an example device in cross-sectional view 100D can include the flexible substrate 110, a source electrode 150D, a drain electrode 160D, a semiconductor layer 140D, a dielectric layer 130D, and a gate electrode 120D. Each of the layers 120D, 130D, 140D, 150D and 160D can include various compositions in accordance with the composition of FIG. 2A in states 200A in 200B. It is to be understood that the respective compositions of 120D, 130D, 140D, 150D and 160D can be distinct from one another with respect to electrical properties and can exhibit physical properties with respect to solidification in response to exposure to ultraviolet irradiation. It is to be further understood that the structure of device 100D can correspond to the structure illustrated in 100A, and can be formed by the mask structures illustrated by way of example in FIGS. 3-7. It is to be further understood that the order of fabrication illustrated in 100D can be achieved by the methods of FIGS. 9-14, and that present implementations are not limited to the order of steps illustrated by way of example herein.

Figure 1E:
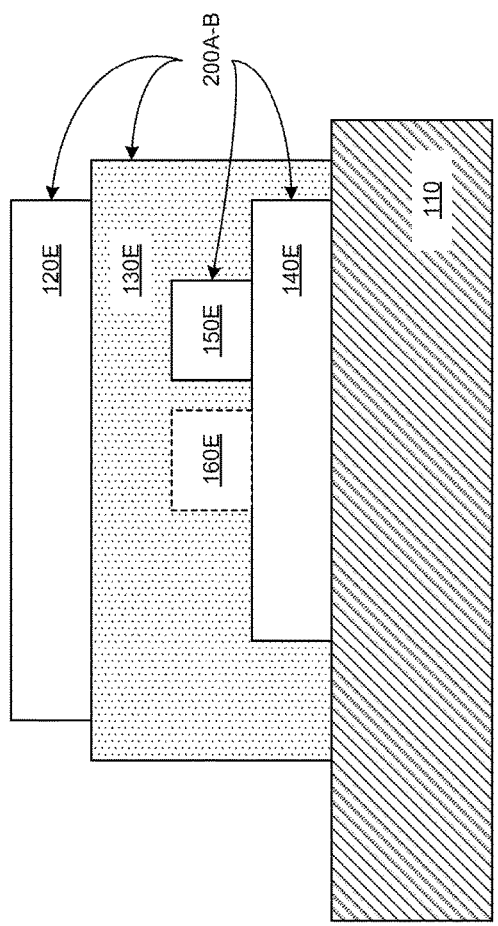
FIG. 1E illustrates a cross-sectional view of a flexible electronic device in accordance with present implementations.

FIG. 1E illustrates a cross-sectional view of a flexible electronic device in accordance with present implementations. As illustrated by way of example in FIG. 1E, an example device in cross-sectional view 100E can include the flexible substrate 110, a semiconductor layer 140E, a source electrode 150E, a drain electrode 160E, a dielectric layer 130E, and a gate electrode 120E. Each of the layers 120E, 130E, 140E, 150E and 160E can include various compositions in accordance with the composition of FIG. 2A in states 200A in 200B. It is to be understood that the respective compositions of 120E, 130E, 140E, 150E and 160E can be distinct from one another with respect to electrical properties and can exhibit physical properties with respect to solidification in response to exposure to ultraviolet irradiation. It is to be further understood that the structure of device 100E can correspond to the structure illustrated in 100A, and can be formed by the mask structures illustrated by way of example in FIGS. 3-7. It is to be further understood that the order of fabrication illustrated in 100E can be achieved by the methods of FIGS. 9-14, and that present implementations are not limited to the order of steps illustrated by way of example herein.

Figure 2B:
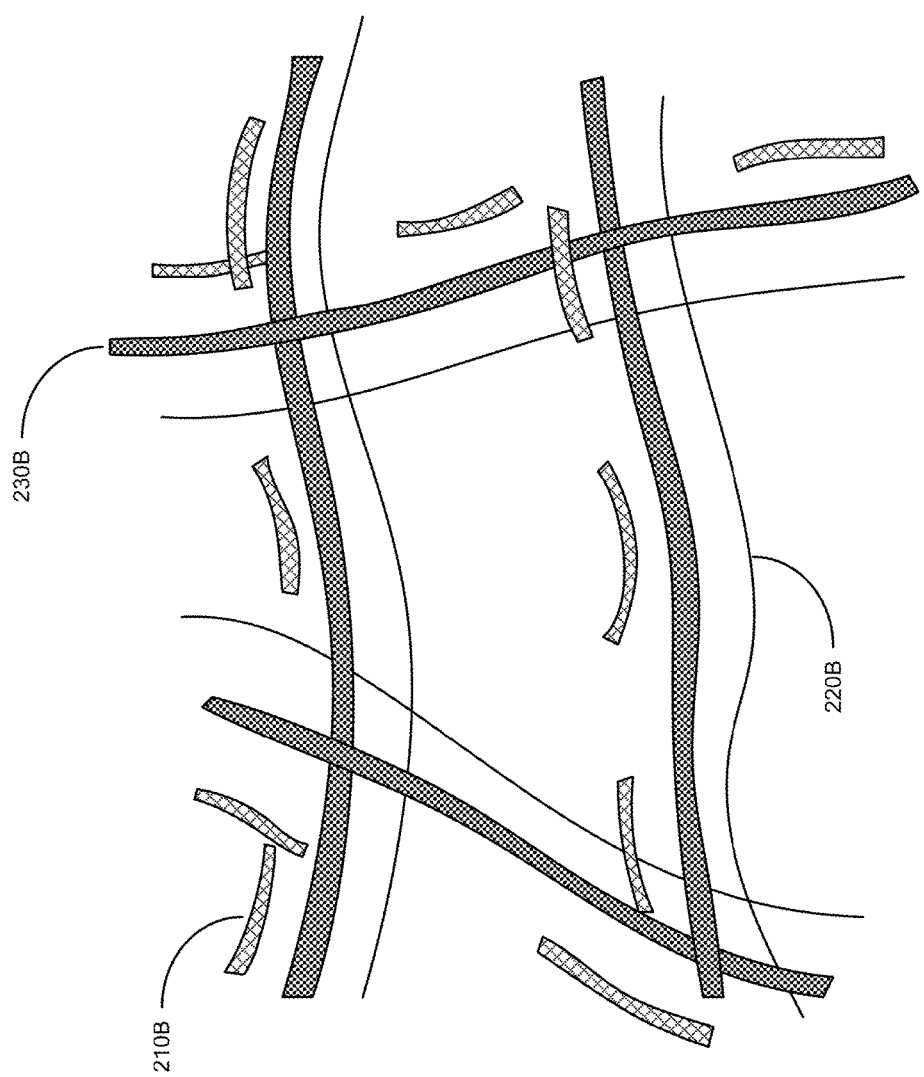
FIG. 2B illustrates a state of a composition of a flexible electronic device in response to irradiation, further to the state of FIG. 2A.

FIGS. 2A-B are directed to optical lithography on polymeric electronic materials. Present implementations can advantageously apply a post-functionalization property of polymeric materials, and benefits of photolithography including high spatial resolution and low cost per patterned element. Thus, present implementations can directly pattern multiple electro-active materials via a sequence of UV light exposure. The process can be achieved without any photoresist, stripping, protection, etching, transfer or lamination processes processes. A light-triggered carbene insertion reaction can crosslink semiconducting polymers and insulating polymers, including the layers 120, 130, 140 and 150. Thus, present implementations can advantageously achieve 2 μm channel length in elastic transistors and a high device density of 42,000 transistors/cm$^2$ or more. This density is over two orders of magnitude higher than, for example, various elastic transistor arrays. The crosslinking-based patterning strategy can advantageously enable robust immobilization of each layer and chemical resistance, thus enabling layer-by-layer sequential deposition at wafer scale.

FIG. 2A illustrates a state of a composition of a flexible electronic device before irradiation, in accordance with present implementations. As illustrated by way of example in FIG. 2A, an example composition in a first state 200A can include a solution having a developing solvent including a first component 210A in the first state 200A and a second component 220A in the first state 200A, and can include a crosslinker 230A in the first state 200A. As one example, the first component can include poly(3,4-ethylenedioxythiophene) ("PEDOT"), the second component can include polystyrene sulfonate ("PSS"), and the crosslinker can include Polyethylene glycol dimethacrylate ("PEGDMA"). In the state 200A, the solution is in a substantially liquid state, and can be moved on and removed from a solid surface on which it is deposited. The crosslinker 220A can be disposed dissolved in the solution, and can include a plurality of disconnected, or unlinked portions 230A within the solution components 210A and 220A. As one example, a substantially liquid state can include a gel-like state in which a composition have a viscosity or surface tension sufficient to maintain cohesion of a particular volume thereof. The first state 200A can include a state in which the composition of 200A is in a substantially liquid state. As one example, the first state 200A can be present prior to an exposure to irradiation of the composition 200A. As one example, the irradiation can include exposure to ultraviolet (UV) irradiation.

FIG. 2B illustrates a state of a composition of a flexible electronic device in response to irradiation, further to the state of FIG. 2A. As illustrated by way of example in FIG. 2B, an example composition in a second state 200B can include a solution having a developing solvent including a first component 210B in a second state and a second component 220B in a second state, and can include a crosslinker 230B in a second state. The crosslinker 220B can be no longer dissolved in the solution, and can include one or more connected, or crosslinked portions 230B within the together with the solution components 210B and 220B. As one example, a substantially solid state can include a state in which a composition is bonded to itself and to the surface on which it is disposed. The second state 200B can include a state in which the composition of 200B is in a substantially solid state. As one example, the second state 200B can be present subsequent to an exposure to irradiation of the composition 200A, to form the composition 200B. As one example, the irradiation can include exposure to ultraviolet irradiation. Structures of the solution components 210A and 220A can change in response to irradiation, to form the solution components 210B and 220B.

An interaction between PEDOT and PEG can result in a microstructure transition of PEDOT:PSS from core-shell structure into more extended chains. After ultraviolet light irradiation, the DMA-modified PEG can undergo a rapid radical polymerization to form a crosslinked network. The intermolecular interaction between the PEDOT:PSS and PEGDMA structures can enable the UV-exposed regions to be resistant to subsequent water development, while those UV-unexposed regions can remain water-soluble.

UV-exposed areas of the layers 120, 130, 140, 150 and 160 can transition from water-soluble to water-insoluble, when the PEGDMA to PEDOT:PSS weight percentage (wt %) is in between a particular range. As one example, a weight percentage of PEGDMA to PEDOT:PSS supporting a transition from liquid to solid in response to UV irradiation, is from 110 to 158 wt %. Film can remain soluble in water after UV exposure with insufficient PEGDMA present in the system. Excessive PEGDMA can lead to undesirable physical crosslinking of the film before UV exposure, thus preventing nano/micropatterning. Changes in water solubility before and after UV exposure can depend formation of a chemically crosslinked PEG network, and dense packing between physically crosslinked regions. As one example, mixing 115 wt % of PEGDMA and 5 wt % of water-soluble initiator vs. PEDOT, can achieve a negative PEDOT:PSS pattern after UV light exposure and subsequent development with water. As another example, UV irradiation can be produced by a light source having a wavelength of 365 nm. Addition of PEG can also advantageously increase PEDOT:PSS conductivity, because the PEDOT forms closer stacking and more interconnected nanofiber network and the insulating PSS shell is reduced. The conductivity can be advantageously enhanced from 12 S/m for the original PEDOT:PSS to 3152 S/m for PEDOT:PSS with 129 wt % of PEGDMA. Ethanol treatment can further improve conductivity to 52521 S/m.

It is to be understood that the first component 210A-B, the second component 220A-B, and the crosslinker 230A-B are not limited to the compositions discussed above. As one example, each of the first component 210A-B, the second component 220A-B, and the crosslinker 230A-B can include different substances to achieve different electrical properties. Nonliming examples of substances corresponding to the first component 210A-B, the second component 220A-B, and the crosslinker 230A-B are discussed at least with respect to FIGS. 9-14.

As one example, in crosslinking of the layers of the device 100 in accordance with stats 200A-B, a gel point can occur when the longest polymer chains in the film reached infinite molecular weight (MW) and, therefore, are insoluble in developing solvent, e.g., chloroform. Higher MW has a lower initial solubility and, hence, a lower critical crosslinker concentration can realize full insolubility against the developing solvent. When the MW of the DPP polymer is equal to or higher than 49 k, less than 10 wt % of branched-diazirine can realize a 99% film retention. Semiconducting polymer containing patterns with advantageous feature sizes down to 4 μm can be thus obtained.

As another example, branch-diazirine is advantageous as a general crosslinker that can be used to pattern all common alkylated conjugated polymers, including poly(3-hexylthiophene) (P3HT), isoindigo-bithiophene semiconducting polymers with carbosilane sidechains (PII2T-C6) and a n-type naphthalenediimide (NDI)-based polymer, P(NDI2TOD). Dielectric polymers can also be directly patterned into different shapes with resolution down to 8 µm by adding 10 wt % of branch-diazirine crosslinker into the system. Dielectric properties of PMMA-PnBA-PMMA and SEBS elastomer advantageously show negligible dependence on UV crosslinking and solvent development steps during fabrication.

Figure 3:
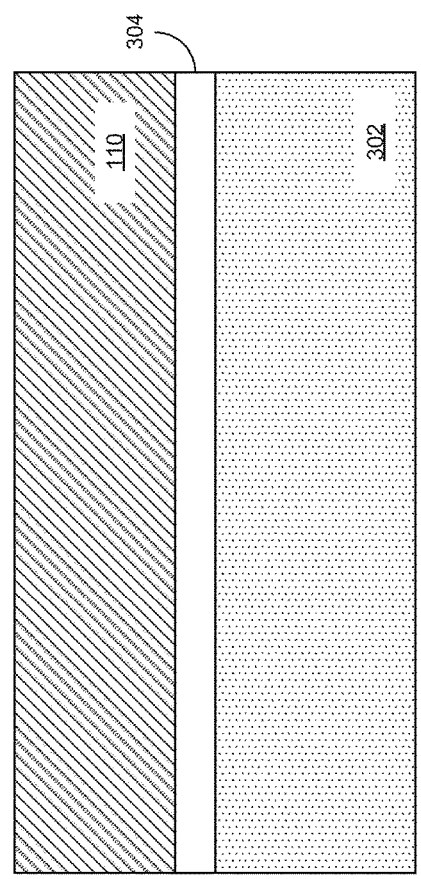
FIG. 3 illustrates a state of a flexible electronic device in accordance with present implementations.

FIG. 3 illustrates a state of a flexible electronic device in accordance with present implementations. As illustrated by way of example in FIG. 3, an example device in state 300 can include a manufacturing substrate 302, a bonding layer 304, and the flexible substrate 110. The manufacturing substrate 302 can include a silicon wafer, for example. The bonding layer 304 can include dextran, for example.

Figure 4:
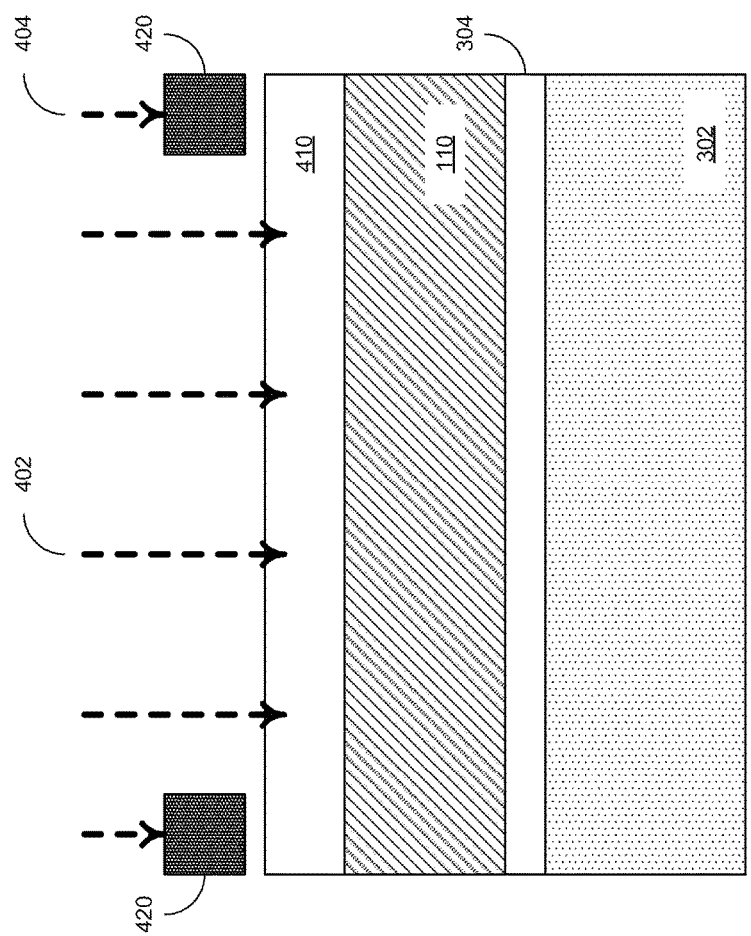
FIG. 4 illustrates a state of a flexible electronic device further to the state of FIG. 3.

FIG. 4 illustrates a state of a flexible electronic device further to the state of FIG. 3. As illustrated by way of example in FIG. 4, an example device in state 400 can include the manufacturing substrate 302, the bonding layer 304, the flexible substrate 110, a gate layer 410, and a gate mask 420. UV irradiation can be applied to a top surface of the device in state 400, with the irradiation 402 contacting the gate layer 410, and the irradiation 404 being blocked from contacting the gate layer 410 by the gate mask 420. In state 400, the gate layer 410 can be deposited over the flexible substrate 110, and the gate mask 420 can be placed on or over the gate layer 410. The gate mask 420 can have a shape in a plan view corresponding to the shape of the gate electrode 120. As one example, the gate mask 420 can have an opening corresponding to the shape of the gate electrode 120, to allow the irradiation 402 to solidify a portion of the gate layer 410 corresponding to the position and shape of the gate electrode 120.

Figure 5:
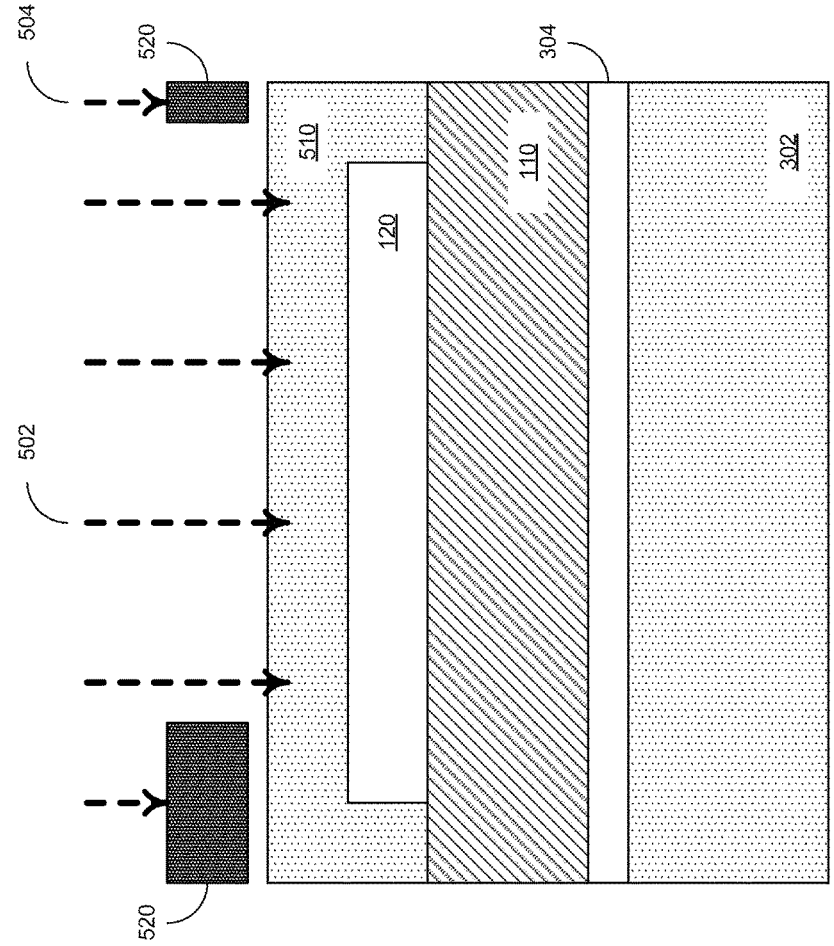
FIG. 5 illustrates a state of a flexible electronic device further to the state of FIG. 4.

FIG. 5 illustrates a state of a flexible electronic device further to the state of FIG. 4. As illustrated by way of example in FIG. 5, an example device in state 500 can include the manufacturing substrate 302, the bonding layer 304, the flexible substrate 110, the gate electrode 120, a dielectric layer 510, and a dielectric mask 520. UV irradiation can be applied to a top surface of the device in state 500, with the irradiation 502 contacting the dielectric layer 510, and the irradiation 504 being blocked from contacting the dielectric layer 510 by the dielectric mask 520. In state 500, the dielectric layer 510 can be deposited over the flexible substrate 110 and the gate electrode 120, and the dielectric mask 520 can be placed on or over the dielectric layer 510. The dielectric mask 520 can have a shape in a plan view corresponding to the shape of the dielectric layer 130. As one example, the dielectric mask 520 can have an opening corresponding to the shape of the dielectric layer 130, to allow the irradiation 502 to solidify a portion of the dielectric layer 510 corresponding to the position and shape of the dielectric layer 130.

Figure 6:
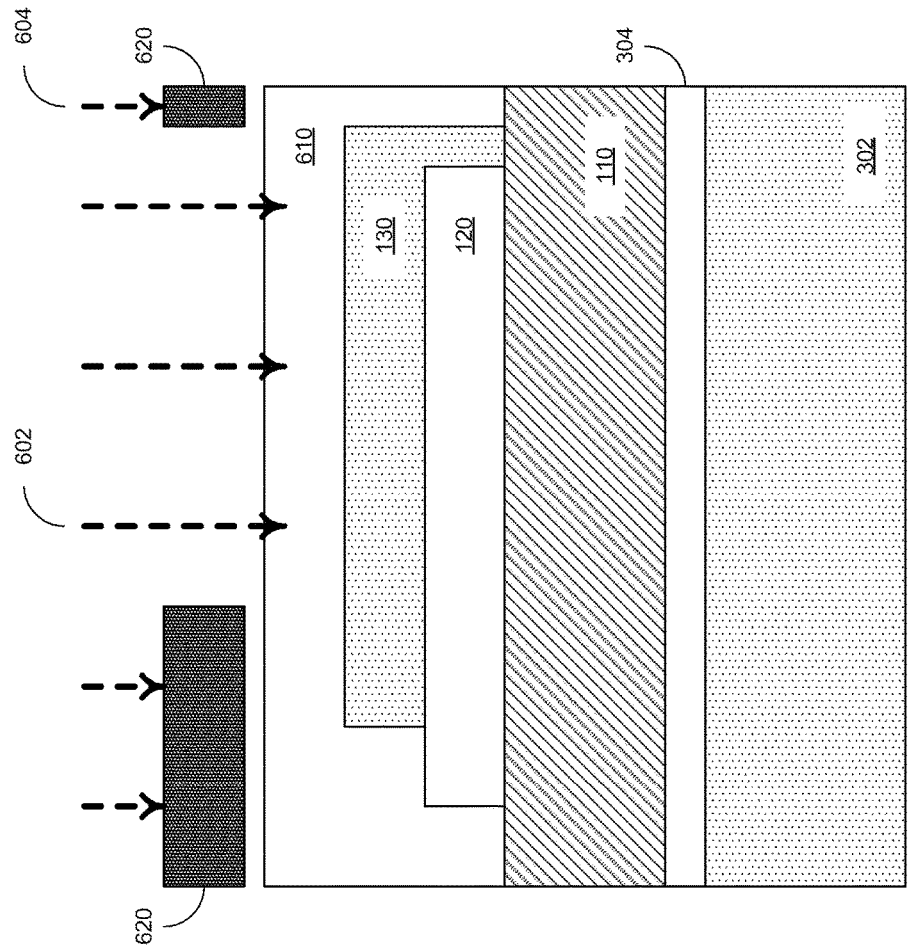
FIG. 6 illustrates a state of a flexible electronic device further to the state of FIG. 5.

FIG. 6 illustrates a state of a flexible electronic device further to the state of FIG. 5. As illustrated by way of example in FIG. 6, an example device in state 600 can include the manufacturing substrate 302, the bonding layer 304, the flexible substrate 110, the gate electrode 120, the dielectric layer 130, a semiconductor layer 610, and a semiconductor mask 620. UV irradiation can be applied to a top surface of the device in state 600, with the irradiation 602 contacting the semiconductor layer 610, and the irradiation 604 being blocked from contacting the semiconductor layer 610 by the semiconductor mask 620. In state 600, the semiconductor layer 610 can be deposited over the flexible substrate 110 and the dielectric layer 130, and the semiconductor mask 620 can be placed on or over the semiconductor layer 610. The semiconductor mask 620 can have a shape in a plan view corresponding to the shape of the semiconductor layer 140. As one example, the semiconductor mask 620 can have an opening corresponding to the shape of the semiconductor layer 140, to allow the irradiation 602 to solidify a portion of the semiconductor layer 610 corresponding to the position and shape of the semiconductor layer 140.

Figure 7:
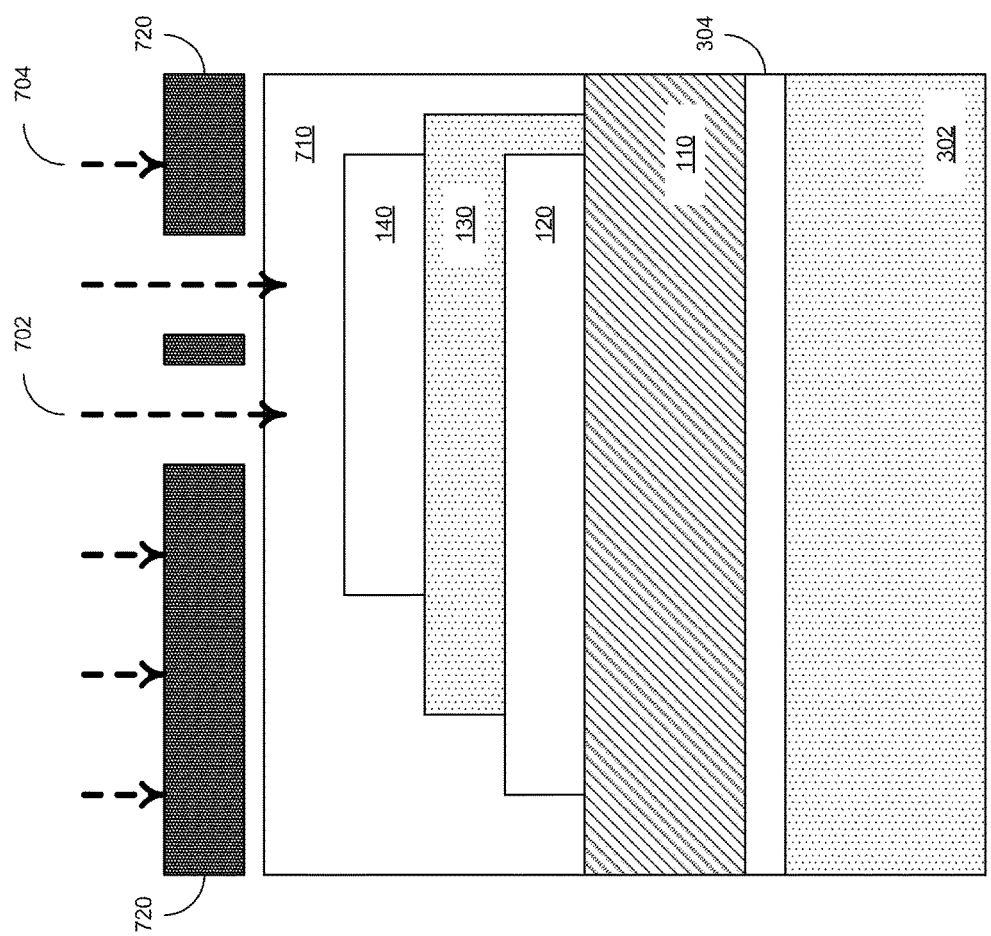
FIG. 7 illustrates a state of a flexible electronic device further to the state of FIG. 6.

FIG. 7 illustrates a state of a flexible electronic device further to the state of FIG. 6. As illustrated by way of example in FIG. 7, an example device in state 700 can include the manufacturing substrate 302, the bonding layer 304, the flexible substrate 110, the gate electrode 120, the dielectric layer 130, the semiconductor layer 140, a terminal layer 710, and a terminal mask 720. UV irradiation can be applied to a top surface of the device in state 700, with the irradiation 702 contacting the terminal layer 710, and the irradiation 704 being blocked from contacting the terminal layer 710 by the terminal mask 720. In state 700, the terminal layer 710 can be deposited over the flexible substrate 110, the dielectric layer 130, and the semiconductor layer 140, and the terminal mask 720 can be placed on or over the terminal layer 710. The terminal mask 720 can have a shape in a plan view corresponding to the shape of the source electrode 150 and the drain electrode 160. As one example, the terminal mask 720 can have a plurality of openings each respectively corresponding to the shape of the source electrode 150 and the drain electrode 160, to allow the irradiation 702 to solidify a portion of the terminal layer 710 corresponding to the positions and shapes of the source electrode 150 and the drain electrode 160.

Figure 8:
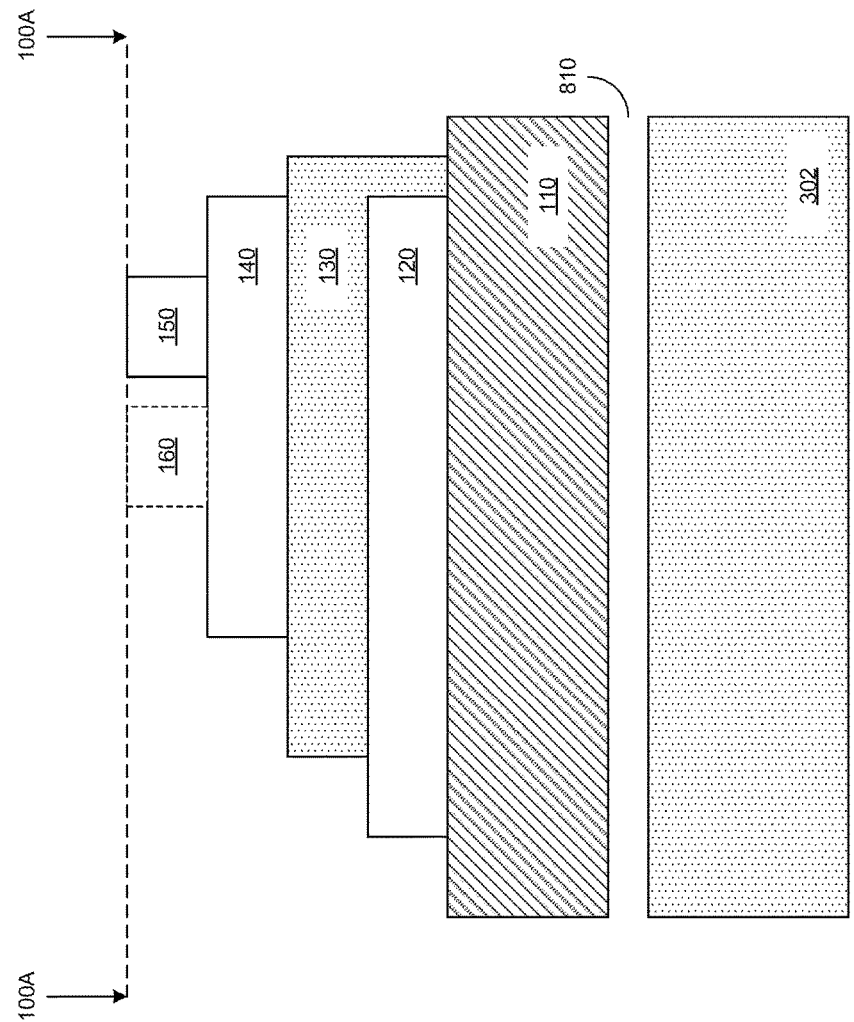
FIG. 8 illustrates a state of a flexible electronic device further to the state of FIG. 7.

FIG. 8 illustrates a state of a flexible electronic device further to the state of FIG. 7. As illustrated by way of example in FIG. 8, an example device in state 800 can include the manufacturing substrate 302, the flexible substrate 110, the gate electrode 120, the dielectric layer 130, the semiconductor layer 140, the source electrode 150, and the drain electrode 160. The state 800 can include a bonding gap 810. In state 800, the bonding layer 304 can be removed to separate the manufacturing substrate 302 from the flexible substrate 110. The device in state 800 can then correspond, once separate from the manufacturing substrate 302, the device 100.

Figure 9:
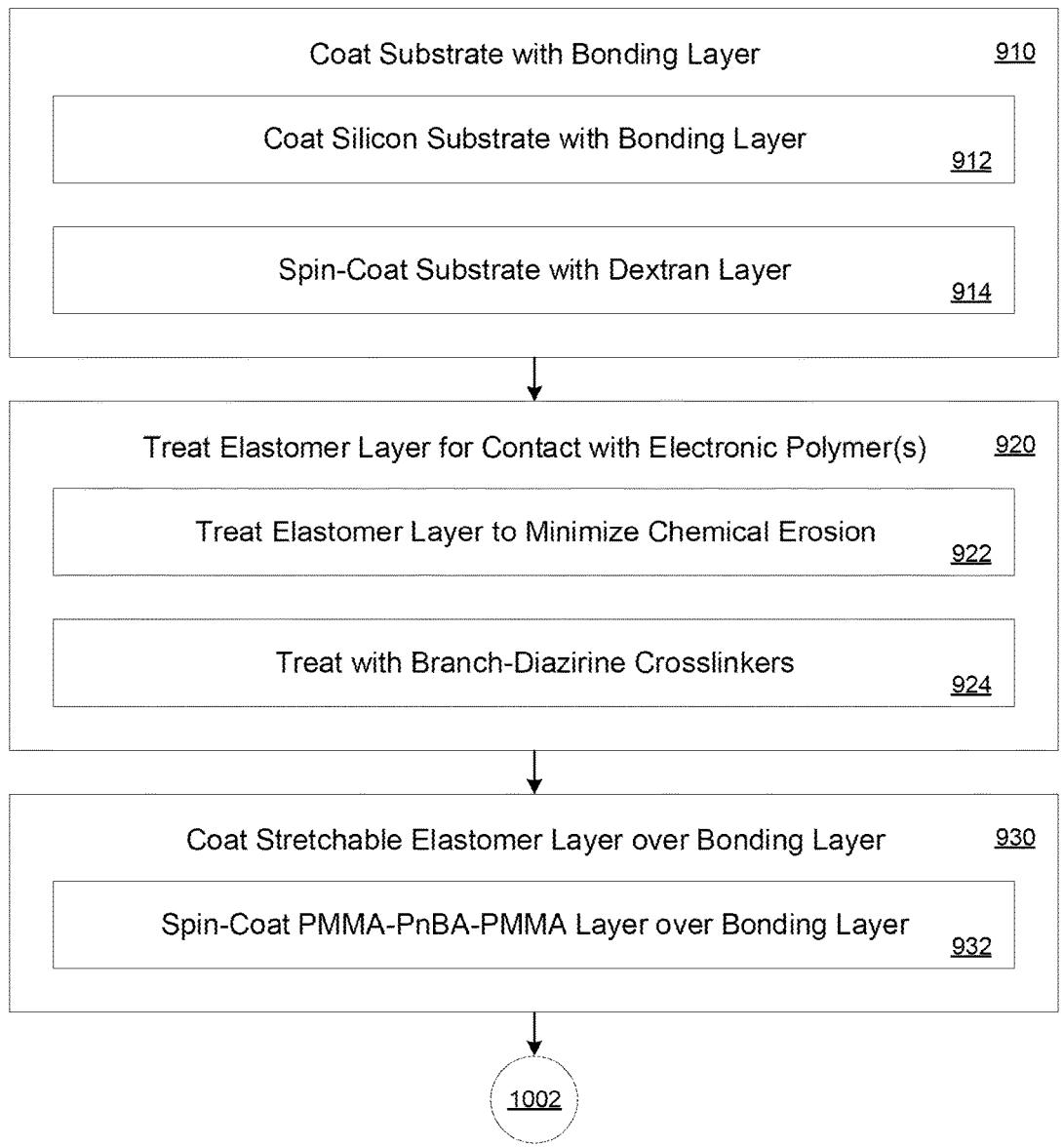
FIG. 9 illustrates a method of manufacturing a flexible electronic device including irradiation, in accordance with present implementations.

FIG. 9 illustrates a method of manufacturing a flexible electronic device including irradiation, in accordance with present implementations. The method 900 can result in one or more of the devices of FIGS. 1A-B and 3-8, according to present implementations. The method 900 can begin at step 910.

At step 910, the method can coat a substrate with a bonding layer. Step 910 can include at least one of steps 912 and 914. At step 912, the method can coat a silicon substrate with the bonding layer. At step 914, the method can spin-coat a substrate with a dextran layer. The method 900 can then continue to step 920.

At step 920, the method can treat an elastomer layer for contact with one or more electronic polymers. The elastomer layer can correspond to the flexible substrate 110. The treatment can correspond to a treatment to advantageously increase mechanical bonding between the elastomer layer and various polymer layers having electrical properties. The treatment can correspond to a treatment to advantageously decrease electrical interference or the like from the elastomer layer, in one or more of a stretch, deformed, or resting state. Step 920 can include at least one of steps 922 and 924. At step 922, the method can treat the elastomer layer to minimize chemical erosion. At step 924, the method can treat the elastomer layer with branch-diazirine crossliners. The method 900 can then continue to step 930.

At step 930, the method can coat the elastomer layer over the bonding layer. The elastomer layer can be, for example, stretchable. Step 930 can include step 932. At step 932, the method can spin-coat a PMMA-PnBA-PMMA layer over the bonding layer. PMMA can correspond to poly(methyl methacrylate), and PnBA can correspond to poly(n-butyl acrylate). The method 900 can then continue to step 1002.

FIG. 10 illustrates a method of manufacturing a flexible electronic device including irradiation, further to the method of FIG. 9. The method 1000 can result in one or more of the devices of FIGS. 1A-B and 3-8, according to present implementations. The method 1000 can begin at step 1002. The method 1000 can then continue to step 1010.

At step 1010, the method can coat a gate electrode layer over the elastomer layer. Step 1010 can include step 1012. At step 1012, the method can spin-coat an electrode layer with PEDOT:PSS and PEGDMA. The method 1000 can then continue to step 1020. At step 1020, the method can mask a surface of a device with a gate electrode pattern. Step 1020 can include step 1022. At step 1022, the method can expose a shape of the gate electrode element through an opening of the mask. The method 1000 can then continue to step 1030.

At step 1030, the method can solidify one or more exposed portions of the gate electrode layer. Step 1030 can include at least one of steps 1032 and 1034. At step 1032, the method can solidify the exposed portions of the gate electrode layer by crosslinking PEGDMA of the gate electrode layer. At step 1034, the method can irradiate the exposed portions of the gate electrode layer by ultraviolet exposure. The method 1000 can then continue to step 1040. At step 1040, the method can remove one or more unexposed portions of the gate electrode layer. Step 1040 can include step 1042. At step 1042, the method can remove unexposed portions of the gate electrode layer corresponding to substantially liquid portions of the gate electrode layer. The method 1000 can then continue to step 1102.

Figure 11:
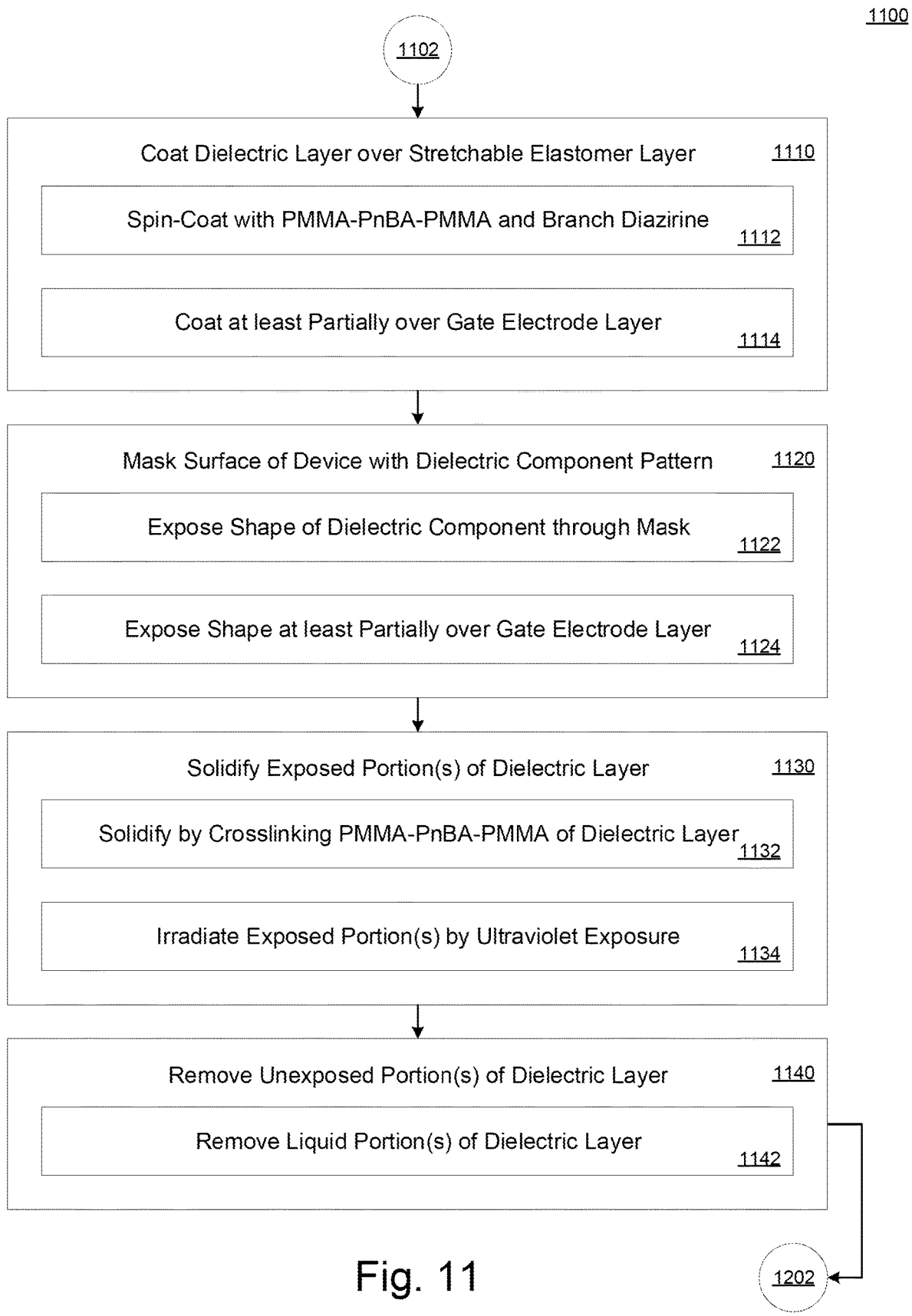
FIG. 11 illustrates a method of manufacturing a flexible electronic device including irradiation, further to the method of FIG. 10.

FIG. 11 illustrates a method of manufacturing a flexible electronic device including irradiation, further to the method of FIG. 10. The method 1100 can result in one or more of the devices of FIGS. 1A-B and 3-8, according to present implementations. The method 1100 can begin at step 1102. The method 1100 can then continue to step 1110.

At step 1110, the method can coat a dielectric layer over the elastomer layer. Step 1110 can include at least one of steps 1112 and 1114. At step 1112, the method can spin-coat a dielectric layer with PMMA-PnBA-PMMA and branch diazirine. At step 1114, the method can coat the dielectric layer at least partially over the gate electrode layer. The method 1100 can then continue to step 1120. At step 1120, the method can mask a surface of a device with a dielectric component pattern. Step 1120 can include at least one of steps 1122 and 1124. At step 1122, the method can expose a shape of the dielectric component through an opening of the mask. At step 1124, the method can expose a shape of the dielectric component at least partially over the gate electrode layer. The method 1100 can then continue to step 1130.

At step 1130, the method can solidify one or more exposed portions of the dielectric layer. Step 1130 can include at least one of steps 1132 and 1134. At step 1132, the method can solidify the exposed portions of the dielectric layer by crosslinking PMMA-PnBA-PMMA of the dielectric layer. At step 1134, the method can irradiate the exposed portions of the dielectric layer by ultraviolet exposure. The method 1100 can then continue to step 1140. At step 1140, the method can remove one or more unexposed portions of the dielectric layer. Step 1140 can include step 1142. At step 1142, the method can remove unexposed portions of the dielectric layer corresponding to substantially liquid portions of the dielectric layer. The method 1100 can then continue to step 1202.

Figure 12:
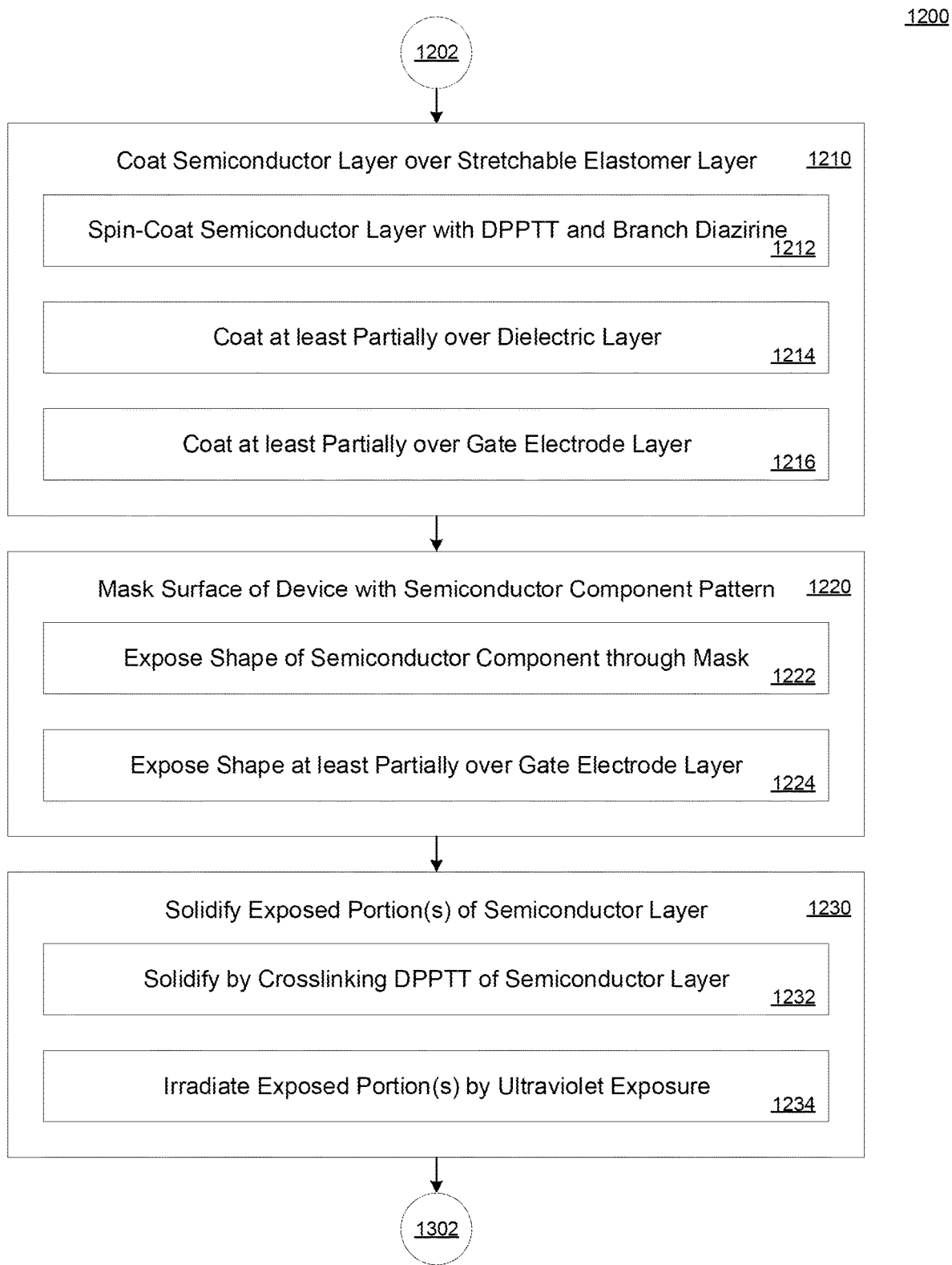
FIG. 12 illustrates a method of manufacturing a flexible electronic device including irradiation, further to the method of FIG. 11.

FIG. 12 illustrates a method of manufacturing a flexible electronic device including irradiation, further to the method of FIG. 11. The method 1200 can result in one or more of the devices of FIGS. 1A-B and 3-8, according to present implementations. The method 1200 can begin at step 1202. The method 1200 can then continue to step 1210.

At step 1210, the method can coat a semiconductor layer over the elastomer layer. Step 1210 can include at least one of steps 1212, 1214 and 1216. At step 1212, the method can spin-coat a semiconductor layer with DPPTT and branch diazirine. As one example, DPPTT can include a polymer including diketopyrrolopyrrole (DPP). At step 1214, the method can coat the semiconductor layer at least partially over the dielectric layer. At step 1216, the method can coat the semiconductor layer at least partially over the gate electrode layer. The method 1200 can then continue to step 1220. At step 1220, the method can mask a surface of a device with a semiconductor component pattern. Step 1220 can include at least one of steps 1222 and 1224. At step 1222, the method can expose a shape of the semiconductor component through an opening of the mask. At step 1224, the method can expose a shape of the semiconductor component at least partially over the gate electrode layer. The method 1200 can then continue to step 1230.

At step 1230, the method can solidify one or more exposed portions of the semiconductor layer. Step 1230 can include at least one of steps 1232 and 1234. At step 1232, the method can solidify the exposed portions of the semiconductor layer by crosslinking DPPTT of the semiconductor layer. At step 1234, the method can irradiate the exposed portions of the semiconductor layer by ultraviolet exposure. The method 1200 can then continue to step 1302.

Figure 13:
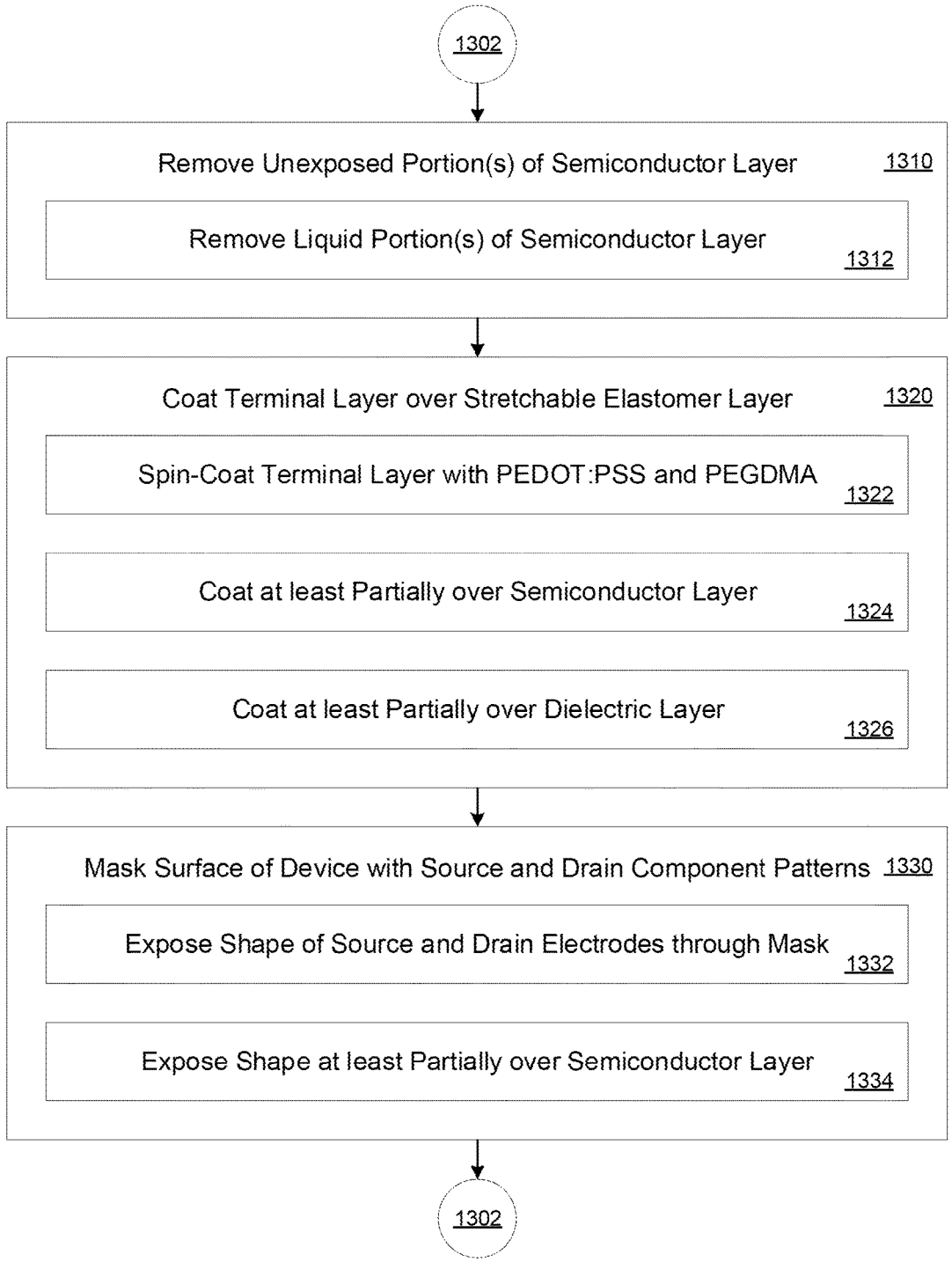
FIG. 13 illustrates a method of manufacturing a flexible electronic device including irradiation, further to the method of FIG. 12.

FIG. 13 illustrates a method of manufacturing a flexible electronic device including irradiation, further to the method of FIG. 12. The method 1300 can result in one or more of the devices of FIGS. 1A-B and 3-8, according to present implementations. The method 1300 can begin at step 1302. The method 1300 can then continue to step 1310.

At step 1310, the method can remove one or more unexposed portions of the semiconductor layer. Step 1310 can include step 1312. At step 1312, the method can remove unexposed portions of the semiconductor layer corresponding to substantially liquid portions of the semiconductor layer. The method 1300 can then continue to step 1320.

At step 1320, the method can coat a terminal layer over the elastomer layer. Step 1320 can include at least one of steps 1322, 1324 and 1326. At step 1322, the method can spin-coat a terminal layer with PEDOT:PSS and PEGDMA. At step 1324, the method can coat the terminal layer at least partially over the semiconductor layer. At step 1326, the method can coat the terminal layer at least partially over the dielectric layer. The method 1300 can then continue to step 1330. At step 1330, the method can mask a surface of a device with source and drain component patterns. Step 1330 can include at least one of steps 1332 and 1334. At step 1332, the method can expose a shape of the source electrode and the drain electrode through an opening of the mask. At step 1334, the method can expose shapes of the source electrode and the drain electrode at least partially over the semiconductor layer. The method 1300 can then continue to step 1402.

Figure 14:
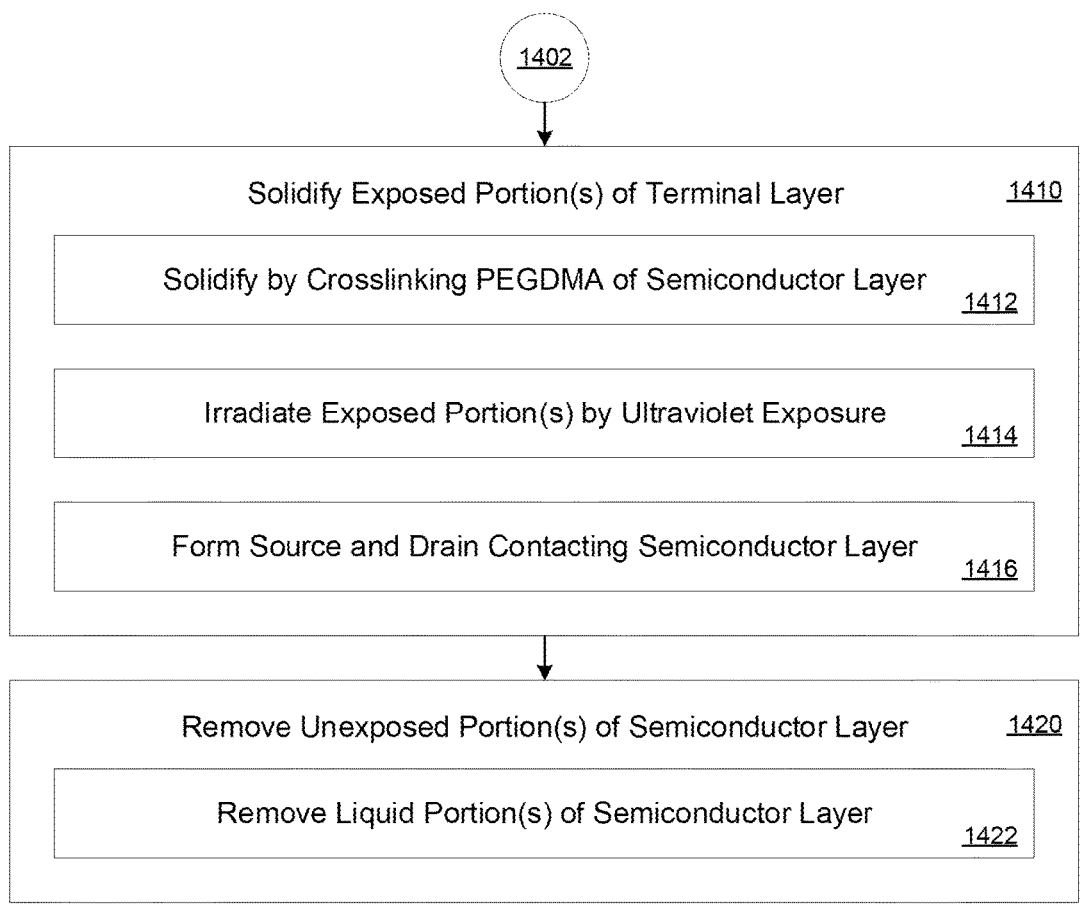
FIG. 14 illustrates a method of manufacturing a flexible electronic device including irradiation, further to the method of FIG. 13.

FIG. 14 illustrates a method of manufacturing a flexible electronic device including irradiation, further to the method of FIG. 13. The method 1400 can result in one or more of the devices of FIGS. 1A-B and 3-8, according to present implementations. The method 1400 can begin at step 1402. The method 1400 can then continue to step 1410.

At step 1410, the method can solidify one or more exposed portions of the terminal layer. Step 1410 can include at least one of steps 1412, 1414 and 1416. At step 1412, the method can solidify the exposed portions of the terminal layer by crosslinking PEGDMA of the terminal layer. At step 1414, the method can irradiate the exposed portions of the terminal layer by ultraviolet exposure. At step 1416, the method can form a source electrode and a drain electrode each contacting the semiconductor layer. The method 1400 can then continue to step 1420. At step 1420, the method can remove one or more unexposed portions of the terminal layer. Step 1420 can include step 1422. At step 1422, the method can remove unexposed portions of the semiconductor layer corresponding to substantially liquid portions of the semiconductor layer. The method 1400 can end at step 1400.

The herein described subject matter sometimes illustrates different components contained within, or connected with, different other components. It is to be understood that such depicted architectures are illustrative, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality, and any two components capable of being so associated can also be viewed as being "operably couplable," to each other to achieve the desired functionality. Specific examples of operably couplable include but are not limited to physically mateable and/or physically interacting components and/or wirelessly interactable and/or wirelessly interacting components and/or logically interacting and/or logically interactable components.

With respect to the use of plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.).

Although the figures and description may illustrate a specific order of method steps, the order of such steps may differ from what is depicted and described, unless specified differently above. Also, two or more steps may be performed concurrently or with partial concurrence, unless specified differently above. Such variation may depend, for example, on the software and hardware systems chosen and on designer choice. All such variations are within the scope of the disclosure. Likewise, software implementations of the described methods could be accomplished with standard programming techniques with rule-based logic and other logic to accomplish the various connection steps, processing steps, comparison steps, and decision steps.

It will be further understood by those within the art that if a specific number of an introduced claim recitation is intended, such an intent will be explicitly recited in the claim, and in the absence of such recitation, no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations).

Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general, such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

Further, unless otherwise noted, the use of the words "approximate," "about," "around," "substantially," etc., mean plus or minus ten percent.

The foregoing description of illustrative implementations has been presented for purposes of illustration and of description. It is not intended to be exhaustive or limiting with respect to the precise form disclosed, and modifications and variations are possible in light of the above teachings or may be acquired from practice of the disclosed implementations. It is intended that the scope of the invention be defined by the claims appended hereto and their equivalents.

What is claimed is:

1. A method comprising:
   coating a gate electrode layer having a first composition over an elastomer layer;
   solidifying a portion of the gate electrode layer by irradiation to form a gate electrode;
   coating a dielectric layer having a second composition over the gate electrode;
   solidifying a portion of the dielectric layer by the irradiation to form a gate dielectric;
   coating a semiconductor layer having a third composition over the gate dielectric;
   solidifying a portion of the semiconductor layer by the irradiation to form a device core;
   coating a terminal layer having the first composition over the semiconductor layer; and
   solidifying respective source and drain portions of the terminal layer by the irradiation to form a source electrode and a drain electrode contacting the semiconductor layer.

2. The method of claim 1, the solidifying the portion of the gate electrode comprising:
   crosslinking polyethylene glycol dimethacrylate ("PEGDMA") in the gate electrode by the irradiation.

3. The method of claim 2, the first composition comprising the PEGDMA, poly(3,4-ethylenedioxythiophene) ("PEDOT") and polystyrene sulfonate "PSS") PSS.

4. The method of claim 1, further comprising:
   masking a second portion of the gate electrode layer distinct from the portion of the gate electrode layer, to block crosslinking of polyethylene glycol dimethacrylate ("PEGDMA") in the second portion of the gate electrode layer by the irradiation.

5. The method of claim 1, the solidifying the portion of the dielectric layer comprising:
   crosslinking poly(methyl methacrylate) ("PMMA")-poly (n-butyl acrylate) ("PnBA")-PMMA in the dielectric layer by the irradiation.

6. The method of claim 5, the second composition comprising the PMMA-PnBA-PMMA and branch diazirine.

7. The method of claim 1, further comprising:
   masking a second portion of the dielectric layer distinct from the portion of the dielectric layer, to block crosslinking of poly(methyl methacrylate) ("PMMA")-poly (n-butyl acrylate) ("PnBA")-PMMA in the second portion of the dielectric layer by the irradiation.

8. The method of claim 1, the solidifying the portion of the semiconductor layer comprising:
   crosslinking diketopyrrolopyrrole-thieno[3,2-b]thiophene ("DPPTT") in the semiconductor layer by the irradiation.

9. The method of claim 8, the third composition comprising the diketopyrrolopyrrole-thieno[3,2-b]thiophene ("DPPTT") and branch diazirine.

10. The method of claim 1, further comprising:
    masking a second portion of the semiconductor layer distinct from the portion of the semiconductor layer, to block crosslinking of DPPTT in the second portion of the dielectric layer by the irradiation.

11. The method of claim 1, the solidifying the portion of the terminal layer comprising:
    crosslinking polyethylene glycol dimethacrylate ("PEGDMA") in the terminal layer by the irradiation.

12. The method of claim 1, further comprising:
    masking a second portion of the terminal layer distinct from the portion of the gate electrode, to block crosslinking of polyethylene glycol dimethacrylate ("PEGDMA") in the second portion of the terminal layer by the irradiation.

13. The method of claim 1, the irradiation comprising exposure to ultraviolet radiation.

14. The method of claim 1, further comprising:
    coating the elastomer layer over a substrate, the elastomer layer including a stretchable elastomer.

* * * * *